United States Patent [19]
Lin et al.

[11] Patent Number: 5,714,891
[45] Date of Patent: Feb. 3, 1998

US005714891A

[54] MULTIPLE-VALUED LITERAL CIRCUIT USING RESONANT TUNNELING DIODES

[76] Inventors: Hung C. Lin, 8 Schindler Ct., Silver Spring, Md. 20903; Tang Hao, 2205 Mark Ct., Silver Spring, Md. 20910

[21] Appl. No.: 650,178

[22] Filed: May 20, 1996

[51] Int. Cl.$^6$ .................................................... H03K 19/10
[52] U.S. Cl. ............................ 326/59; 326/134; 327/499
[58] Field of Search ....................... 326/59–60, 134–135; 327/498–499, 583, 407–408, 415–416

[56] References Cited

U.S. PATENT DOCUMENTS

| | | | |
|---|---|---|---|
| 5,017,817 | 5/1991 | Yamakawa | 326/59 |
| 5,128,894 | 7/1992 | Lin | 365/168 |
| 5,247,298 | 9/1993 | Wei et al. | 341/133 |
| 5,280,445 | 1/1994 | Shieh et al. | 365/175 |
| 5,563,530 | 10/1996 | Frazier | 326/59 |

Primary Examiner—Jon Santamauro

[57] ABSTRACT

A multiple-valued literal circuit is implemented with resonant tunneling diodes (RTD). A number of RTD sections are connected in series with a current source. Current is tapped by a current bleeder between every two adjacent RTD sections. The current bleeders are turned on at different levels of input voltage, which is applied at the joint between the current source and the RTD sections. When the voltage reaches a certain threshold level, the current bleeder with the highest threshold voltage is turned on and taps the most current from the current source, depleting the current from other current bleeders with lower threshold voltages. Thus only one dominant current is tapped from the current source. The literal circuit can be used for multiple-valued decoders, multiplexers, demultiplexers and other multiple-valued digital systems.

21 Claims, 9 Drawing Sheets

1

MULTIPLE-VALUED LITERAL CIRCUIT USING RESONANT TUNNELING DIODES

BACKGROUND OF THE INVENTION

This invention relates to a multiple-valued logic circuit-in particular to a literal circuit for decoders, multiplexers and demultiplexers using resonant tunneling diodes.

In present day digital circuits, binary logic is in general use. In a binary logic, two logic levels "0" and "1" are used. Thus, a memory cell can only store two states, and a transmission line can only transmit two levels of signals.

Multiple-valued logic has been proposed to increase the packing density of integrated circuits, for instance, by increasing the number of states in a single memory cell, and by increasing the number of levels in a transmission line. However, due to circuit complexity, multiple-valued logic digital systems have not been widely accepted commercially.

The resonant tunneling device such as the resonant tunneling diode (RTD), has a unique folding voltage-current (V-I) characteristic, which lends itself readily for multiple-valued logic operations. The RTD promises not only circuit simplification, but also very high speed. Some multiple-valued applications in memory and in analog-to-digital converters have been disclosed previously, e.g. in U.S. Pat. Nos. 5,280,445 and 5,247,298.

In many other applications, such as a Programmable Logic Array (PLA) and a Combinational Logic, it is often required to use a decoder, a multiplexer and a demultiplexer. For example, a multiplexer can be considered as a universal logic block capable of performing all logic operations. In such applications, there is a need for a literal element. Many attempts have been made to implement such a literal element. F. J. PELAYO et al described a literal generator in a paper, "CMOS Current-Mode Multivalued PLA's", *IEEE Trans. on Circuits and Systems*, Vol.38, No. 4, April, 1991. Due to the use of conventional CMOS devices, the speed is slow and the circuit area is uneconomical. Takahiro HANYU et al described a literal circuit in a paper "Multiple-Valued Programmable Logic Array Based on a Resonant-Tunneling Diode Model" in IEICE Trans. Electron. Vol. E76-C, No. 7, July 1993. However, the circuit requires varying the characteristics of the different RTDs in the same circuit. The adjustment of different RTD characteristics on the same integrated structure is difficult and impractical.

SUMMARY

An object of this invention is to implement a multiple-valued literal circuit with high density and high speed. Another object of this invention is to implement a multiple-valued decoder using the resonant tunneling diodes. Still another object of this invention is to implement a multiple-valued multiplexer using resonant tunneling diodes. A further object of this invention is to implement a multiple-valued demultiplexer using resonant tunneling diodes.

These objects are achieved in this invention by connecting a number of RTD sections in series with a current source and tapping the current at different joints between the RTD sections. The current is tapped by current bleeders which are turned on at different threshold levels of input voltage applied at the joint between the current source and the RTD sections. When the input voltage reaches a certain level, the current bleeder with the corresponding threshold voltage is turned on, taps the most current from the current source, and depletes the current from other current bleeders with lower threshold voltages. Thus only one dominant current is tapped from the current source.

DETAILED DESCRIPTION OF THE PREFERRED EMBODIMENT

Figure 1A:
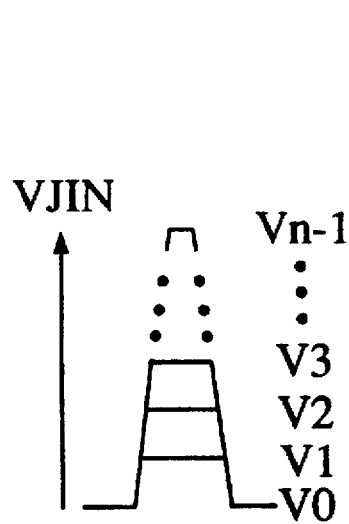
FIG. 1a shows a multiple-valued triggering pulse.
Figure 1B:
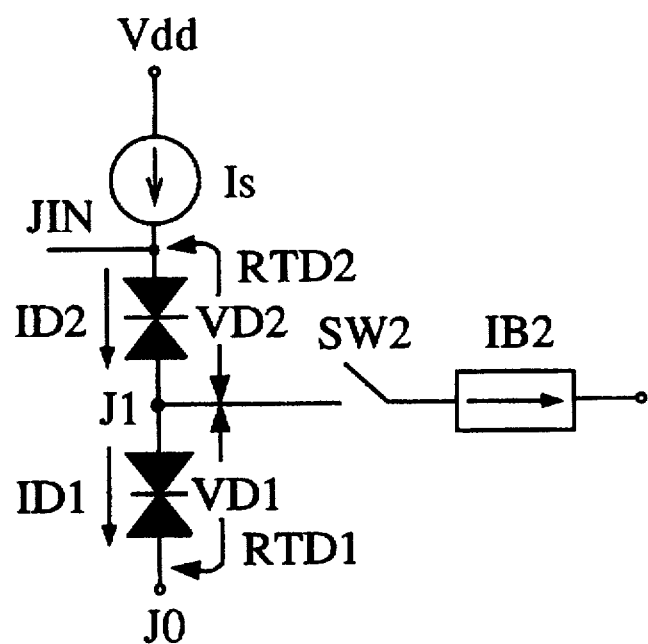
FIG. 1b shows the basic current tapping principle of the present invention.

The principle of this invention is to tap the current from a current source at different joints between any two adjacent resonant tunneling diode sections which are connected in series. The basic circuit is shown in FIG. 1b. A current source is is fed from tap JIN through two resonant tunneling diode sections RTD1 and RTD2 with a tap J1 toward tap J0. A current bleeder IB2 Is connected to J1 through a switch SW2. When SW2 is closed, the current from the current source Is is tapped by the current bleeder IB2. The switch SW2 is controlled by the voltage VD2 across RTD2. When the joint JIN is triggered by a pulse VJIN (as depicted in FIG. 1a) which exceeds a threshold value, the switch SW2 is turned on, and the current ID1 through RTD1 is reduced. Most of the current from the current source Is then flows through the current bleeder IB2.

Figure 2:
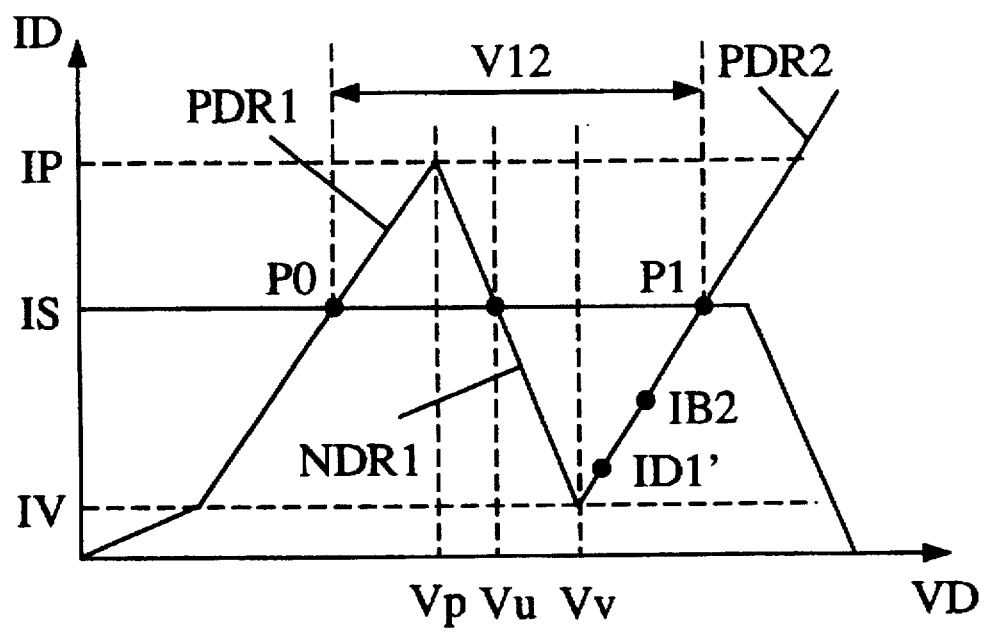
FIG. 2 shows the folding V-I characteristic of a single-peak RTD section intersected by a current source as a load.

The operation of this circuit is depicted in FIG. 2. The RTD section displays a folding V-I characteristic with two positive differential resistance regions PDR1 and PDR2 separated by a voltage pitch V12 and a negative differential resistance region NDR1, where the ordinate is the current ID through the RTD and the abscissa is the voltage VD across the RTD. The current source Is, with supply voltage Vdd, is capable of intersecting the RTD characteristic at two stable operating points P0 and P1. When the voltage across the RTD is triggered to exceed the unstable operating point voltage Vu, the operating point would settle at point P1.

When the switch SW2 is not on, the current ID1 through RTD1 is equal to Is and is set at the operating point P1. Meanwhile, the RTD2 is set at the PDR1 region with the same current Is. However, when RTD2 is triggered to operate in the PDR2 region, the voltage across the RTD2 exceeds the threshold voltage of the switch SW2 and turns on SW2. Most of the current from Is is then tapped away by the current bleeder IB2 and the current through RTD1 settles at a point with a much lower current ID1' than the tapped current IB2, i.e. IB2>>ID1' and IB2+ID1'=Is.

Figure 3:
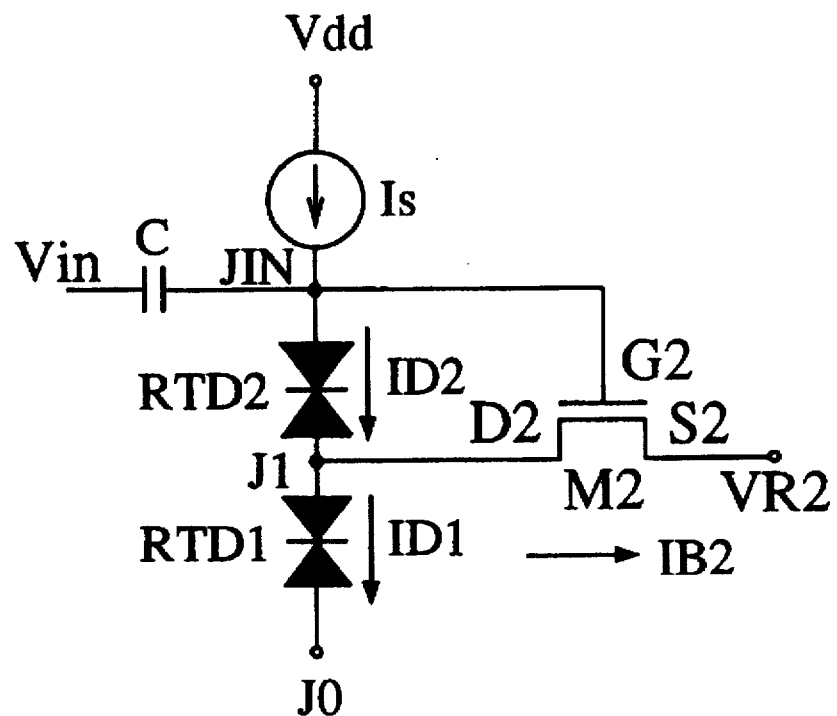
FIG. 3 shows the use of a MOSFET as a current bleeder based on the present invention.

The switch SW2 is most readily constructed with an enhancement mode MOS field effect transistor (MOSFET) M2 as shown in FIG. 3 with the drain D2 connected to J1, the gate G2 connected to JIN and the source S2 connected to a reference voltage VR2, which is higher than the valley voltage Vv of the folding V-I characteristic. The threshold voltage Vt of M2 is preferably chosen higher than the valley voltage Vvl to operate M2 in the current saturation region of the MOSFET V-I characteristic. Thus, when the input voltage Vin fed through capacitor C causes a voltage at joint JIN to exceed Vt with respect to VR1, the MOSFET M2 is turned on and taps the current from the current source Is. The source current of M2 is then the tapped current IB2.

Figure 5:
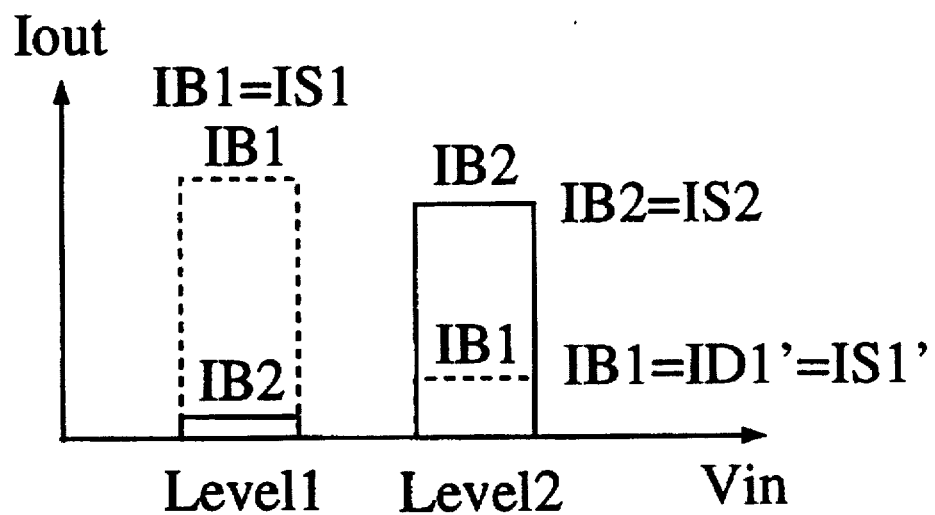
FIG. 5 shows the selected output level as a function of input voltage level.
Figure 4:
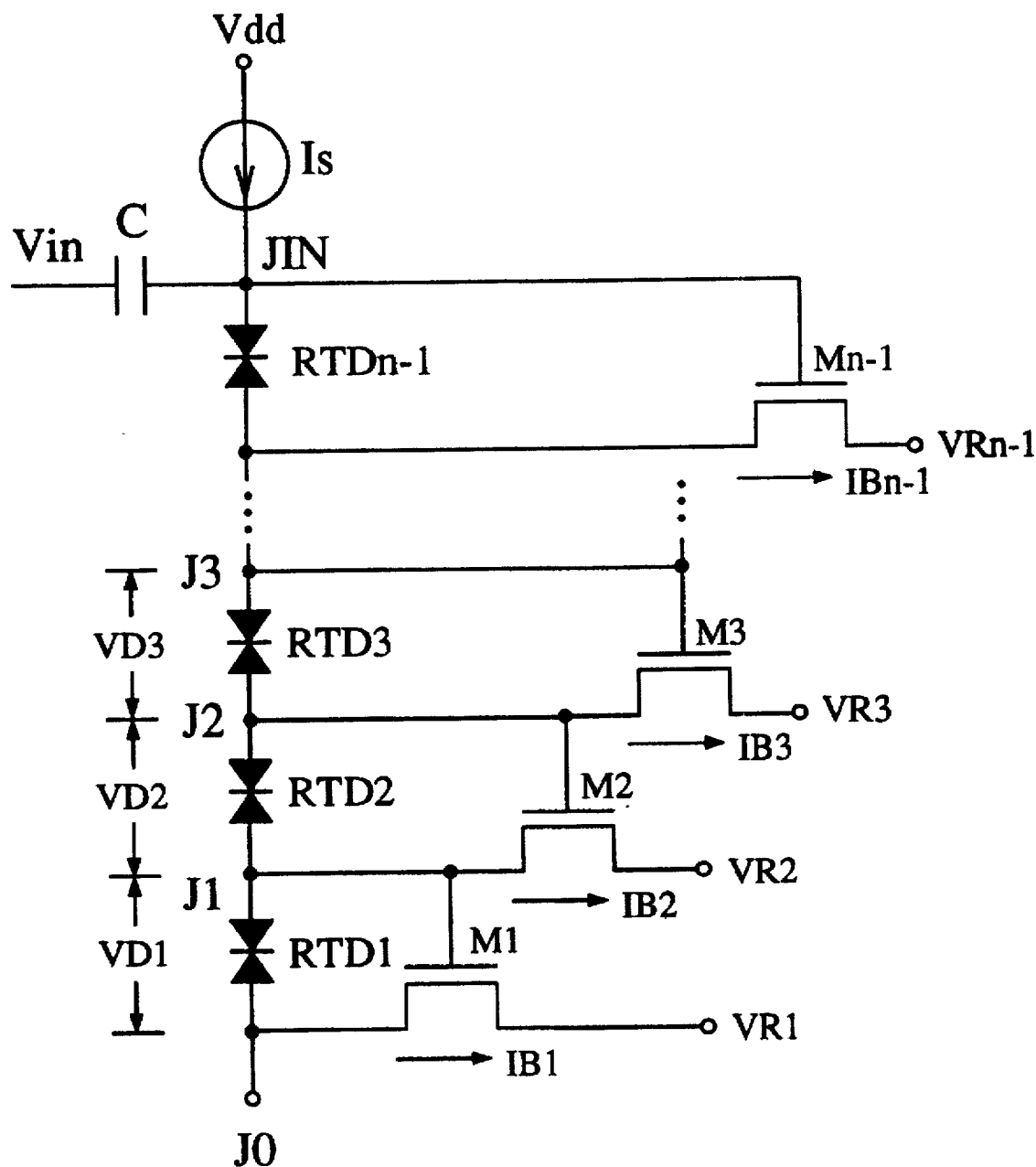
FIG. 4 shows the current bleeders for (n−1) values.

For multiple-valued operation, there should be (n–1) RTD sections RTD1, RTD 2, . . . . , $RTD_{n-1}$ connected in series as shown in FIG. 4, where n is the radix of the multiple-valued logic. The current bleeders comprise (n–1) MOSFETs M1, M2, . . . , $M_{n-1}$, with the drains connected to different taps J1, J2, etc. between any two adjacent RTD sections and the gates connected to the respective higher taps. The sources of M1, M2, . . . $M_{n-1}$ are connected to different progressively higher reference voltages VR1, VR2, . . . . , $VR_{n-1}$, respectively. The input voltage is fed to the joint JIN between the current source Is and the topmost $RTD_{n-1}$. The operation is similar to that in FIG. 2. When the voltage at JIN produces a voltage drop across the RTD1 to exceed the valley voltage Vv but a voltage drop across RTD2 not to exceed the peak voltage of RTD2, the RTD1 operates in the second positive differential resistance region PDR2 and RTD2 operates in the first positive differential region PDR1 region, as are RTD3 . . . $RTD_{n-1}$. Thus, M1 is turned on and taps a current Is1=IB1, (in dotted line) but M2 and other MOSFETs are not turned on, as shown in FIG. 5 with negligible IB2 at Level 1 Vin.

When the input voltage is increased to Level 2 such that RTD2 operates in the PDR2 region and the gate to source voltage of M2 exceeds the threshold voltage Vt of M2, M2 is turned on and most of the current from the current source Is is tapped by the drain of M2, appearing as source current IB2. Then the current through M1 is depleted and reduced from Is or ID1 to a much lower value ID1', i.e. IB2>>ID1' and IB2+ID1'=Is. The change in output currents IB1 (in dotted line) and IB2 (in solid line) as Vin changes from Level 1 to Level 2 is depicted in FIG. 5.

When the input voltage is further increased, the next higher MOSFET M3 is triggered to turn on and bleeds most of the current from the current source Is. The RTD currents of the lower RTD sections RTD1 and RTD2 are depleted. Thus, there is only one dominant source current among all the MOSFETs, namely that of M3.

Figure 6A:
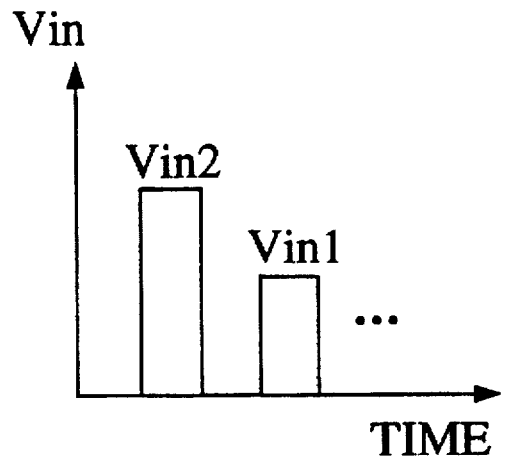
FIG. 6a shows the input voltage as sampled multiple-valued signals.
Figure 6B:
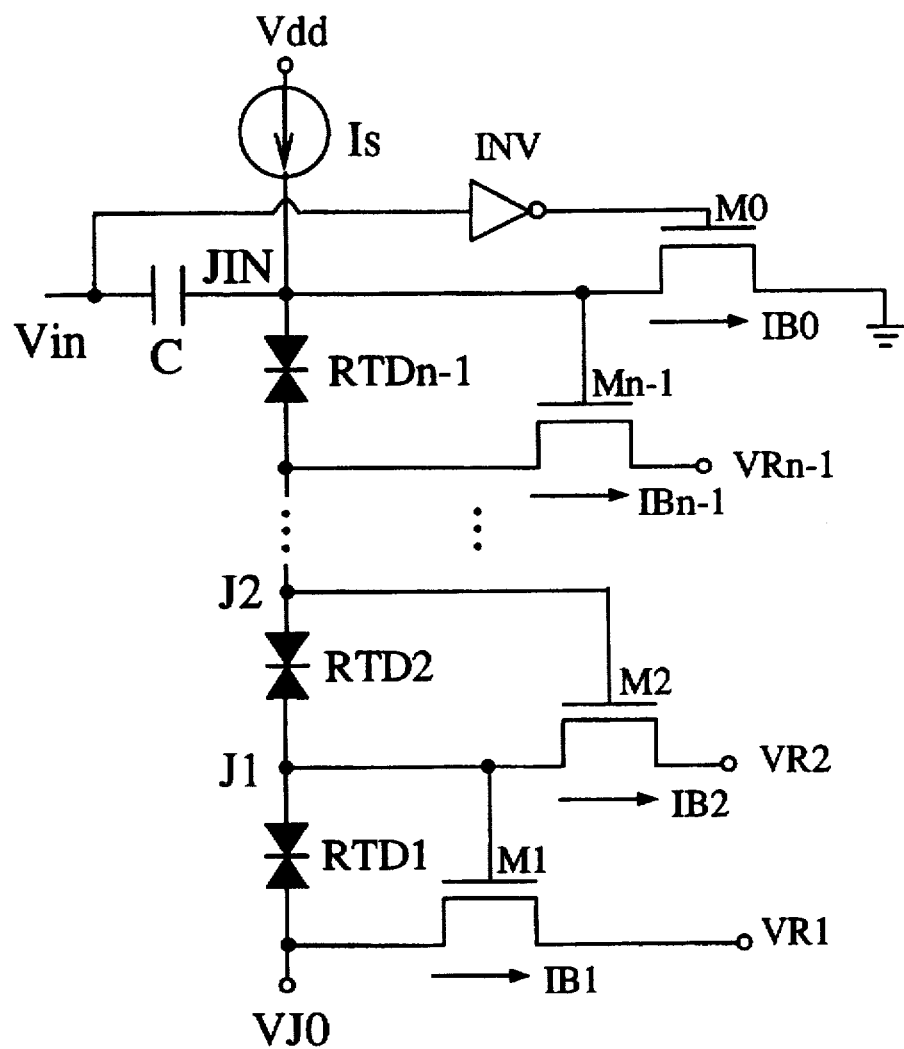
FIG. 6b shows the addition of a zero-level current bleeder to reset the literal circuit and to operate as an n-output decoder.

The series RTD sections thus connected provides (n–1) tapped current outputs. For the lowest level input signal, i.e. Level 0, the output current is derived not from the series RTD sections. The current is tapped at the input joint JIN as shown in FIG. 6b. The drain of a MOSFET M0 is connected to this joint, and the source of M0 is connected to a lowest reference voltage, say ground. The gate of M0 is controlled by the output of an inverter INV. The input of the inverter is controlled by the input voltage Vin. When Vin is zero, which is the lowest multiple-valued logic level, the output of INV becomes high and turns on M0, which draws all the current from the current source Is. At any other input voltage level, M0 is off. The source current of M0 represents the Level 0 output current IB0. Together with M0 as a current bleeder, the current source Is can be selectively tapped by n current bleeders and there are n tapped current outputs to represent n radix and to operate as a decoder.

When M0 turns on, all RTD sections RTD1 through RTDn-1 are reset to the lower PDR1 region in FIG. 2. This reset step is necessary after every setting of input signal Vin as shown in FIG. 6a. Otherwise, after the highest level of Vin, say Vin2, turns on M2, the lower levels of Vin, say Vin1, would not turn M1 fully on, because RTD2 is already latched in the higher positive differential resistance region PDR2 and keeps M2 on to tap the dominant current from the current source Is. However, after VIN is reset to zero, Vin can set the dominant tapped current to any desired output. Therefore, the input voltage Vin should be a sampled multiple-valued signal as shown in FIG. 6a.

When the topmost RTD turns on the associated MOSFET $M_{n-1}$ with source current $Is_{n-1}$, all the lower MOSFETs M1, M2, etc. operate at a lower source current Is'(=ID1') and the sum of the lower currents is equal to (n–1)Is'. Thus, the sum (n–1)Is'+$Is_{n-1}$=Is. For proper operation, the tapped current from the current source Is must be higher than Is' to be dominant and less than the peak current Ip to lie within the region PDR2 (referring to FIG. 2). At the same time, the low source current Is' must also lie in the PDR2 region, because a lower than Iv current would cause the operating point of the RTD1 to fall back on the low voltage PDR1 region. If the lower RTD1 section falls back to the PDR1 region, the next higher RTD2 section also follows to fall back to the PDR1 region and the associated MOSFET M2 would not turn on. From the foregoing observation, the following requirements must be met:

$$Ip>Is>Is_{n-1}>Is'>Iv,$$

and $$Is=Is_{n-1}+(n-1)Is'.$$

For the limiting case, when Is=Ip, Is'=Iv, and $Is_{n-1}$>Is', one obtains that:

$$n<Ip/Iv.$$

From this relationship, it can be seen that the maximum number of radix n is limited by the peak to valley current ratio.

For proper operation, the current bleeder for RTD1 should turn on first at the lowest level input voltage. The current bleeder for the next higher input voltage level should turn on next. When a number of RTDs are connected in series and are initially biased in the lower PDR1 region, the RTD with the lowest peak current Ip is the first RTD to switch from the lowest PDR1 region to the higher PDR2 region in response to any trigger. To ensure that the lowest RTD1 should switch first, the peak current Ip of RTD1 should be lower than that of RTD2, and the peak current of RTD2 should be lower than that of the next higher RTD 3, and so forth.

Figure 7A:
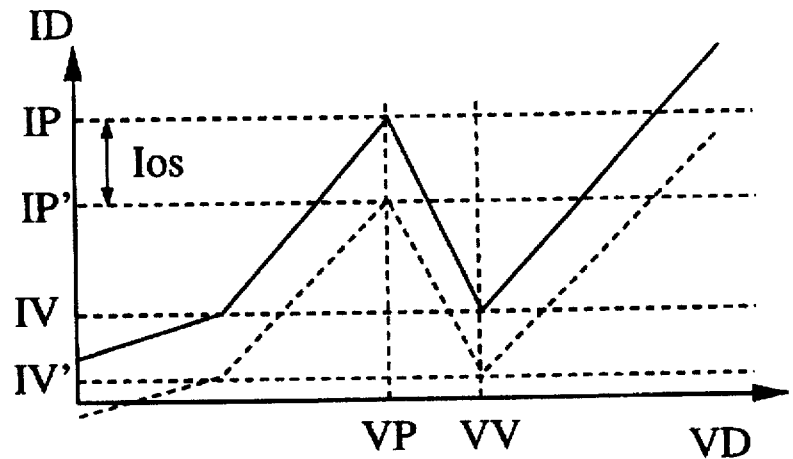
FIG. 7a shows the use of a reverse current source to increase the peak current to valley current ratio of the RTDs.
Figure 7B:
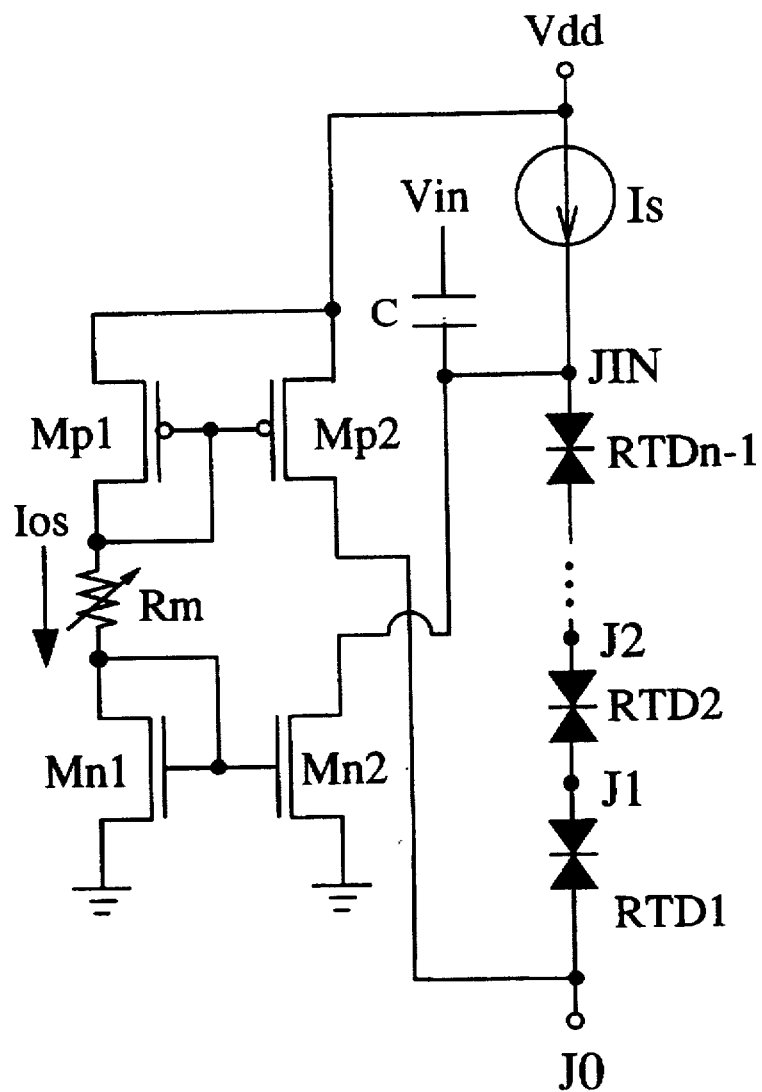
FIG. 7b shows a CMOS current mirror to produce the reverse current.

To improve the peak current to valley current ratio, an offset current Ios can be flown through the RTD in opposite direction as shown in FIG. 7a. The circuit is a complementary MOS current mirror comprising a PMOS current mirror with PMOS Mp1 and Mp2 and an NMOS current mirror with NMOS Mn1 and Mn2 as shown in FIG. 7b. The resistor Rm can be adjusted to control the offset current Ios so as to shift the valley current Iv nearly equal to zero. In so doing, the Ip/Iv ratio can be greatly increased and the number of radix n can also be increased.

Figure 8:
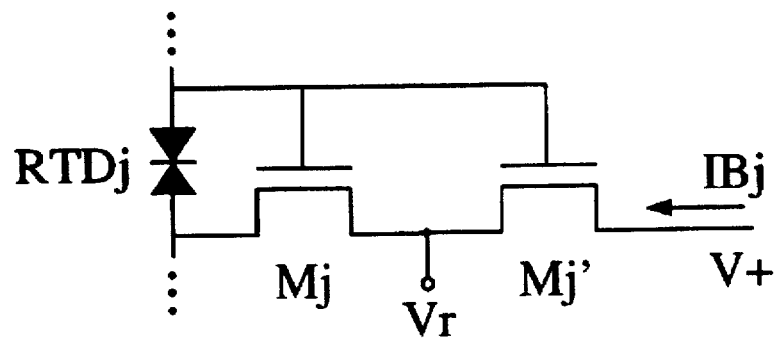
FIG. 8 shows a method to sense the output current.
Figure 9:
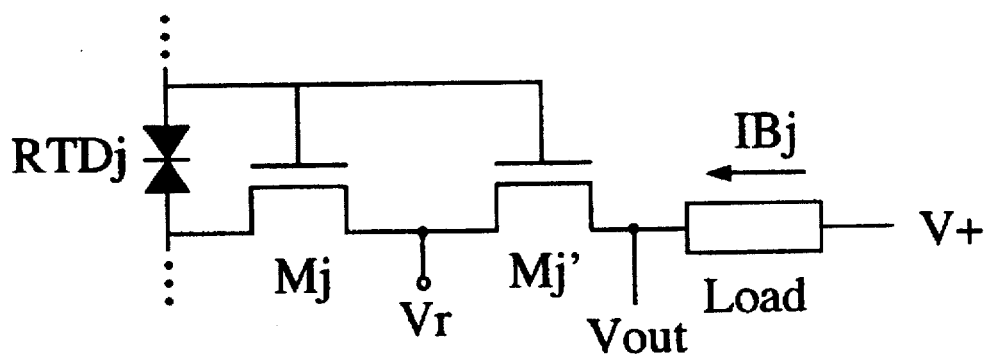
FIG. 9 shows the use of a load to convert an output current into an output voltage.
Figure 10A:
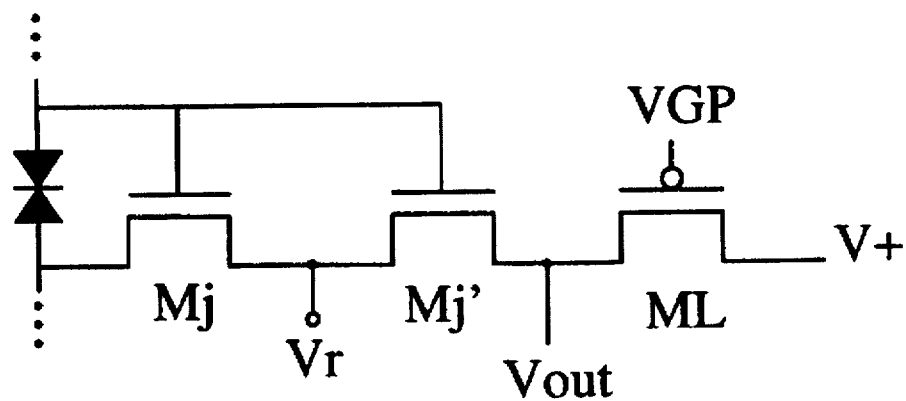
FIG. 10a shows the use of a PMOS as a load.
Figure 10B:
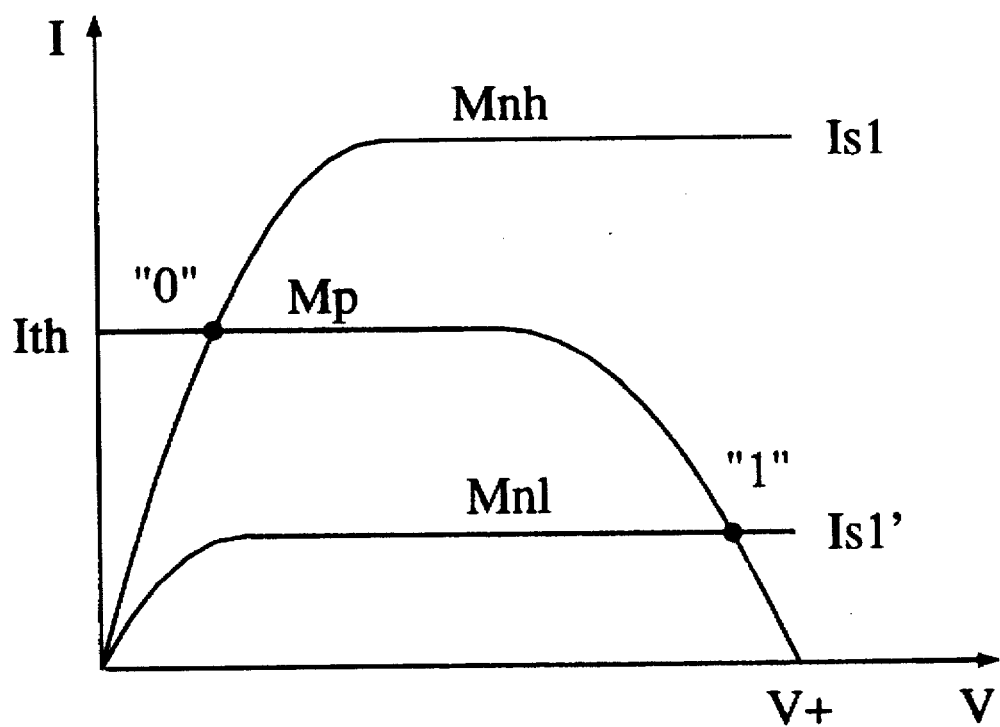
FIG. 10b shows the operation.

The current from the source of each bleeding MOSFET Mj can be sensed. One simple circuit to sense the source current is to connect another MOSFET Mj' with common source and gate as shown in FIG. 8. The drain current of Mj' should be the same as the Mj when Mj' is in the current saturation region and serves as the output current for the literal circuit. If an output voltage is desired, the drain current can be connected to a load device as shown in FIG. 9, such as a resistor, one or more diode or another PMOS $M_L$ as shown in FIG. 10a. With $M_L$ as load, the source is connected to a supply V+ and the gate voltage VGP is adjusted to yield a threshold saturation current $I_{th}$ lower than the dominant bleeding current Isl (e.g. IB2 in FIG. 2) but higher than the less dominant bleeding current Is1' (e.g. ID1' in FIG. 2). The output voltage Vout is derived from the common drain connection of Mj' and $M_L$. When the drain current of Mj' is higher than Ith, Vout is pulled down. When the drain current of Mj' is less than Ith, Vout is pulled up, as depicted graphically in FIG. 10b.

If the width-to-length ratios of gates of Mj and Mj' are different, the saturated drain currents of Mj and Mj' become different. Then the output current can be made different from tapped current.

Figure 11:
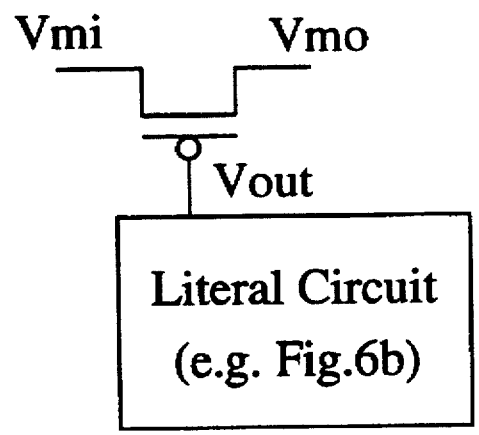
FIG. 11 shows the use of pass transistors in conjunction with the literal circuit to implement a transmission gate.

The output voltages from the literal circuit can be used to control a pass transistor as shown in FIG. 11. In this circuit, the pass transistor is a PMOS with the gate connected to one of the output voltages from the literal circuit. This circuit constitutes a transmission gate with input Vmi and output Vmo.

Figure 12:
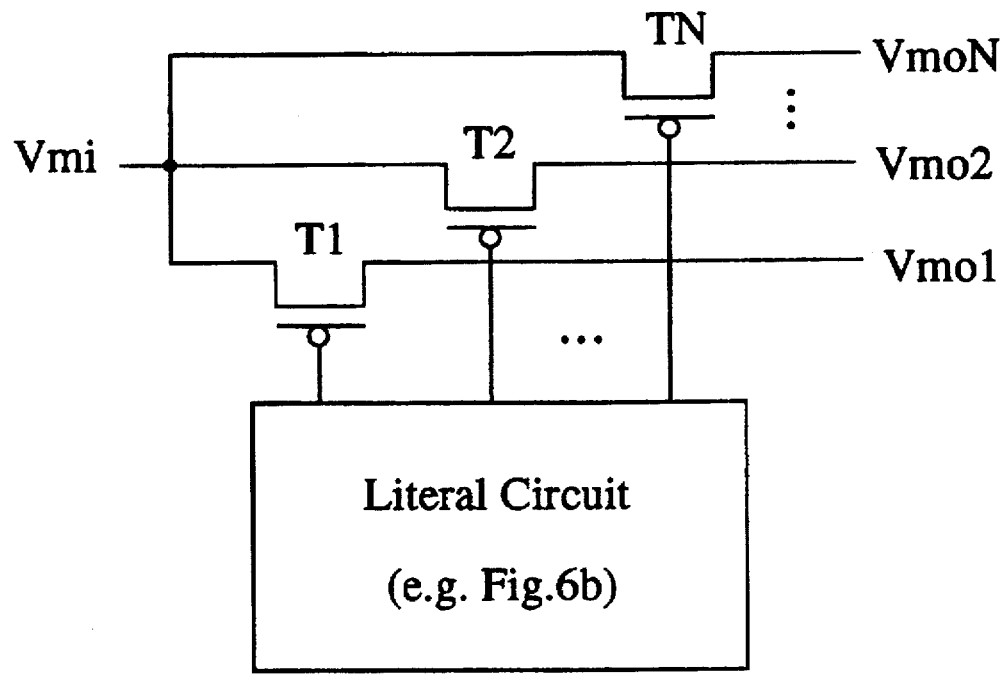
FIG. 12 shows the use of transmission gates in conjunction with the literal circuit to form a demultiplexer.

When the inputs Vmi of pass transistors T1, T2, . . . TN are connected in common, and the outputs Vmo1, Vmo2, . . . VmoN of the pass transistors are not connected in common as shown in FIG. 12, the circuit constitutes a demultiplexer. The input signal can be a multiple-valued signal. Then the demultiplexer becomes a multiple-valued demultiplexer.

Figure 13:
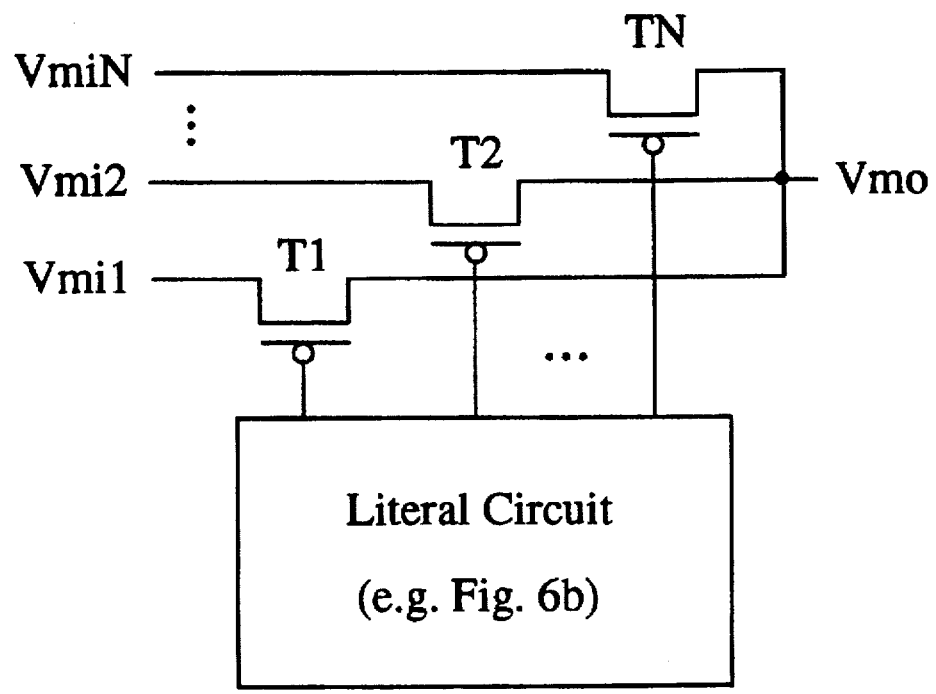
FIG. 13 shows the use of transmission gates in conjunction with the literal circuit to form a multiplexer.

When the outputs Vmo of pass transistors T1, T2, . . . TN are connected in common and the inputs Vmi1, Vmi2, . . . VmiN are not connected in common as shown in FIG. 13, the circuit constitutes a multiplexer, also known as a T-gate. As in the demultiplexer, the signals can be multiple-valued.

Figure 14:
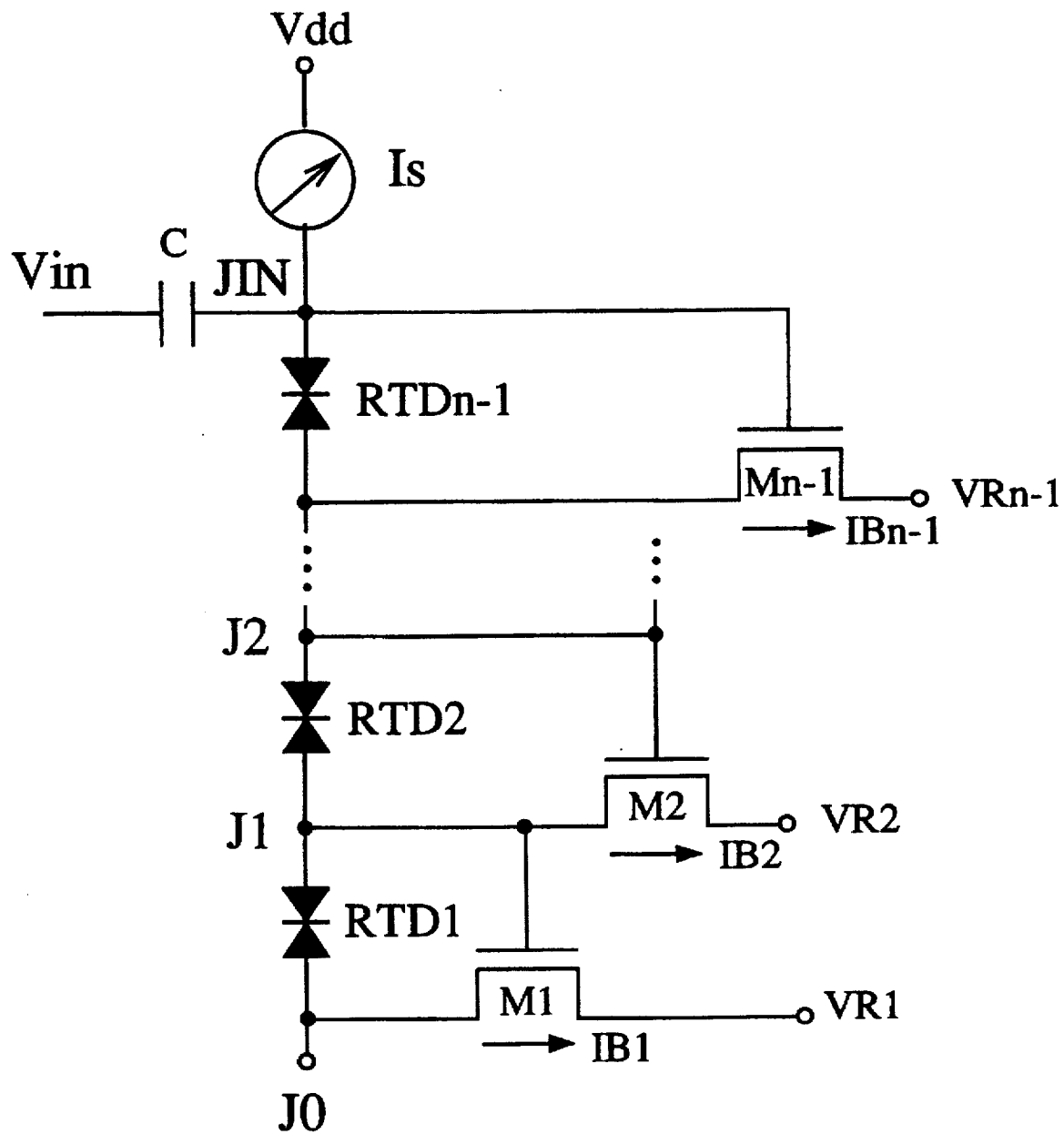
FIG. 14 shows a variable current source to implement another embodiment of the demultiplexer.

When the value of the current source Is is varied as represented by an arrow in FIG. 14, the output current levels IB0 through IBn−1 can be changed. Together with the input signal, there are two dimensions for multiple-valued input, say X-dimension input for Vin and Y-dimension input for Is. This two-dimensional input forms a matrix, which can be used for multiple-valued logic applications. For example, if Is represents a multiple-valued input signal and Vin represents selection, then the output currents represent the selected multiple-valued output. This function becomes that of a demultiplexer.

Although the foregoing literal circuit is described with a single-peak RTD in each section, the RTD is not limited to a single-peak one. Multiple-peak RTD sections can also be used in a similar fashion.

With this basic literal Circuit of the present invention, many multiple-valued digital systems can be derived. While the foregoing description has been devoted to decoders, multiplexers and demultiplexers, the application is not limited to these examples, and any other applications using this basic literal circuit are all within the scope of this invention.

What is claimed is:

1. A multiple-valued literal circuit, comprising:
   a series connection of a plurality of devices, each device having folding voltage-current (V-I) characteristic;
   a current source connected to said series connection;
   an input signal feeding a first joint between said current source and said series connection;
   at least one current bleeder each connected to a second joint between two of said devices, and each of said current bleeders turning having different threshold voltages to turn on in response to said input voltage,
   said threshold voltages having highest value for the first of said current bleeder nearest the input voltage and decreasing in value of said threshold voltages for any said current bleeder placed further away from said input voltage,
   wherein one of the current bleeders, when turned on, depriving current from any other said current bleeder with a lower threshold voltage, said one current bleeder causing the most current bleeding from said current source, and resulting in one single dominant current being tapped; and
   means for sensing the currents from each of said current bleeders.

2. A multiple-valued literal circuit as described in claim 1, wherein each said devices with folding V-I characteristic is a resonant tunneling diode.

3. A multiple-valued literal circuit as described in claim 2, wherein each said resonant tunneling diode has one single folding V-I characteristic, having at least two positive differential resistance regions and one negative differential resistance region.

4. A multiple-valued literal circuit as described in claim 3, wherein the lowest threshold voltage of said threshold voltages lies in the higher than first positive resistance region of said folding V-I characteristic, and next higher threshold voltage of said threshold voltages is higher by a voltage pitch between two adjacent said positive differential resistance regions of said folding V-I characteristic.

5. A multiple-valued literal circuit as described in claim 4, wherein each of said current bleeders is a first field effect transistor (FET) with a drain connected to said second joint, a gate connected to the corresponding second joint of a current bleeder with a higher threshold voltage, and a source connected to a reference voltage which sets the value of said threshold voltage.

6. A multiple-valued literal circuit as described in claim 5, wherein the peak current of said resonant tunneling diode increases as said reference voltage increases.

7. A multiple-valued literal circuit as described in claim 5, wherein the threshold voltage of said FET is larger than one said voltage pitch.

8. A multiple-valued literal circuit as described in claim 5, wherein the current flowing from said source of said FET is sensed.

9. A multiple-valued literal as described in claim 5, wherein said current flowing from said source of said FET is sensed by connecting a second FET with common source and common gate with said first FET and with the drain connected to said means for sensing currents.

10. A multiple-valued literal circuit as described in claim 9, wherein said second FET has a different geometry from said first FET so that the current which is sensed is different from the current which is tapped by the current bleeder.

11. A multiple-valued literal circuit as described in claim 1, wherein said input voltage is fed through a capacitor.

12. A multiple-valued literal circuit as described in claim 8, wherein each current which is sensed is used to control a transmission gate connected between a multiple-valued input and a multiple-valued output.

13. A multiple-valued literal circuit as described in claim 12, wherein more than one output of said transmission gate are connected in common and more than one input of said transmission are not connected in common, thus forming a multiplexer.

14. A multiple-valued literal circuit as described in claim 12, wherein said multiple-valued input of a number of said transmission gate is connected in common and the output of each transmission gate is not connected in common, thus constituting a demultiplexer.

15. A multiple-valued literal circuit as described in claim 1, wherein the current value of said current source is varied to yield different bleeding currents, thus allowing two input variables, one being said input voltage and another being the current of said current source.

16. A multiple-valued literal circuit as described in claim 2, wherein a compensating current flows in opposite direction to the flow of current in the resonant tunneling diode to increase the peak current to valley current ratio of said resonant tunneling diode.

17. A multiple-valued literal circuit as described in claim 16, wherein said compensating current is furnished by a complementary FET current source, comprising a PMOS current mirror and an NMOS current mirror with a common current source.

18. A multiple-valued literal circuit as described in claim 4, wherein another current bleeder is connected to said first joint and is turned on to reset all said RTD sections to said first positive differential resistance region when said input signal is lower than the lowest threshold voltage of said threshold voltages, the current output from said another current bleeder, together with the current outputs from other said current bleeders forming the output of a multiple-valued decoder.

19. A multiple-valued literal circuit as described in claim 18, wherein said another current bleeder is turned on by an inverter controlled by said input signal.

20. A multiple-valued literal circuit as described in claim 19, wherein said another current bleeder is another FET with a drain connected to said first joint, a gate connected to the output of said inverter, and a source connected to ground.

21. A multiple-valued literal circuit as described in claim 1, wherein said input signal is a sampled multiple-valued signal which is reset to zero between any two samples of said sampled multiple-valued signal.

* * * * *